(12) United States Patent
Cader et al.

(10) Patent No.: US 6,836,131 B2
(45) Date of Patent: Dec. 28, 2004

(54) SPRAY COOLING AND TRANSPARENT COOLING PLATE THERMAL MANAGEMENT SYSTEM

(75) Inventors: Tahir Cader, Pullman, WA (US); Nathan Stoddard, Clarkston, WA (US); Donald Tilton, Colton, WA (US); Nader Pakdaman, Los Gatos, CA (US); Steven Kasapi, San Francisco, CA (US)

(73) Assignee: Credence Systems Corp., Milpitas, CA (US)

( * ) Notice: Subject to any disclaimer, the term of this patent is extended or adjusted under 35 U.S.C. 154(b) by 43 days.

(21) Appl. No.: 10/379,925

(22) Filed: Mar. 4, 2003

(65) Prior Publication Data

US 2004/0032275 A1 Feb. 19, 2004

Related U.S. Application Data

(63) Continuation-in-part of application No. 10/222,107, filed on Aug. 16, 2002.

(51) Int. Cl.$^7$ .......................... G01R 31/28; H01L 21/66
(52) U.S. Cl. .......................... 324/760; 324/765; 438/16
(58) Field of Search ................................ 324/760, 765, 324/752; 438/16, 116; 165/80.2, 104.33; 361/689, 699; 257/E23.097, E23.098, E23.099, 714, 719

(56) References Cited

U.S. PATENT DOCUMENTS

| | | | | |
|---|---|---|---|---|
| 5,070,040 A | | 12/1991 | Pankove | 437/209 |
| 5,220,804 A | * | 6/1993 | Tilton et al. | 62/64 |
| 5,285,351 A | * | 2/1994 | Ikeda | 361/699 |
| 5,349,831 A | * | 9/1994 | Daikoku et al. | 62/376 |
| 5,361,032 A | * | 11/1994 | Waterbly | 324/537 |
| 5,511,415 A | | 4/1996 | Nair et al. | 73/204.11 |
| 5,515,910 A | * | 5/1996 | Hamilton et al. | 165/263 |
| 5,579,826 A | | 12/1996 | Hamilton | 165/254 |
| 5,785,754 A | | 7/1998 | Yamamoto et al. | 117/89 |
| 5,895,972 A | | 4/1999 | Paniccia | 257/706 |
| 6,140,141 A | | 10/2000 | Davidson | 438/16 |
| 6,498,725 B2 | * | 12/2002 | Cole et al. | 361/700 |
| 6,621,275 B2 | * | 9/2003 | Cotton et al. | 324/537 |

FOREIGN PATENT DOCUMENTS

JP 05166912 7/1993

OTHER PUBLICATIONS

Silicon Immersion/Heat–sink lens; IBM Technical Disclosure Bulletin; Jan. 1990; 90A60245.
Use of a Diamond–Like Carbon Thin–Film on a Silicon Lens/Heat Sink; IBM Technical Disclosure Bulletin; Oct. 1994;94A63187.
Use of a Diamond Thin–Film on a Silicon Lens/Heat Sink; IBM Technical Disclosure Bulletin; Jun. 1994; 94A61934.
Backside Silicon Integrated Circuit Infrared Immersion Lens/Heat Sink; IBM Technical Disclosure Bulletin; vol. 35, No. 7, Dec. 1992; ISSN 0018–8689.

* cited by examiner

Primary Examiner—Ernest Karlsen
(74) Attorney, Agent, or Firm—Joseph Bach

(57) ABSTRACT

A combination cooling plate and micro-spray cooling system beneficial for use in testers of electrically stimulated integrated circuit chips is disclosed. The system includes a transparent heat spreader and micro-spray heads disposed about the heat spreader. The spray heads spray cooling liquid onto a periphery of said heat spreader so as to remove heat from the chip. Alternatively, and micro-spray heads are provided inside the cooling plate holder so as to spray cooling liquid inside the interior of the holder so that the holder is cooled. The holder is in physical contact with the heat spreader, so that as the holder is cooled by the spray, heat is removed from the heat spreader, and thereby from the chip.

30 Claims, 6 Drawing Sheets

SPRAY COOLING AND TRANSPARENT COOLING PLATE THERMAL MANAGEMENT SYSTEM

REFERENCE TO RELATED APPLICATION

This application is a continuation in part of application Ser. No. 10/222,107 file date Aug. 16, 2002, which is incorporated herein by reference in its entirety.

BACKGROUND OF THE INVENTION

1. Field of the Invention

The present invention relates to a system and a method for thermal management of an electrically stimulated semiconductor integrated circuit undergoing probing, diagnostics, or failure analysis.

2. Description of the Related Art

Integrated circuits (ICs) are being used in increasing numbers of consumer devices, apart from the well-known personal computer itself. Examples include automobiles, communication devices, and smart homes (dishwashers, furnaces, refrigerators, etc.). This widespread adoption has also resulted in ever larger numbers of ICs being manufactured each year. With increased IC production comes the possibility of increased IC failure, as well as the need for fast and accurate chip probing, debug, and failure analysis technologies. The primary purpose of today's probing, debug, and failure analysis systems is to characterize the gate-level performance of the chip under evaluation, and to identify the location and cause of any operational faults.

In the past, mechanical probes were used to quantify the electrical switching activity. Due to the extremely high circuit densities, speeds, and complexities of today's chips, including the use of flip-chip technology, it is now physically impossible to probe the chips mechanically without destructively disassembling them. Thus, it is now necessary to use non-invasive probing techniques for chip diagnostics. Such techniques involve, for example, laser-based approaches to measure the electric fields in silicon, or optically-based techniques that detect weak light pulses that are emitted from switching devices, e.g., field-effect transistors (FETs), during switching. Examples of typical microscopes for such investigations are described in, for example, U.S. Pat. Nos. 4,680,635; 4,811,090; 5,475,316; 5,940,545 and Analysis of Product Hot Electron Problems by Gated Emission Microscope, Khurana et al., IEEE/IRPS (1986), which are incorporated herein by reference.

During chip testing, the chip is typically exercised at relatively high speeds by a tester or other stimulating circuit. Such activity results in considerable heat generation. When the device is encapsulated and is operated in its normal environment, various mechanisms are provided to assist in heat dissipation. For example, metallic fins are often attached to the IC, and cooling fans are provided to enhance air flow over the IC. However, when the device is under test, the device is not encapsulated and, typically, its substrate is thinned down for testing purposes. Consequently, no means for heat dissipation are available and the device under test (DUT) may operate under excessive heat so as to distort the tests, and may ultimately fail prematurely. Therefore, there is a need for effective thermal management of the DUT.

One prior art system used to cool the DUT is depicted in FIG. 1a. The cooling device 100 consists of a cooling plate 110 having a window 135 to enable optical probing of the DUT. The window 135 may be a simple cut out, or may be made of thermally conductive transparent material, such as synthetic diamond. The use of synthetic diamond to enhance cooling is described in, for example, U.S. Pat. No. 5,070,040, which is incorporated herein by reference. Such a solid transparent window is often referred to as a transparent heat spreader. Conduits 120 are affixed to the cooling plate 110 for circulation of cooling liquid. Alternatively, the conduits may be formed as an integral part of the plate, see, e.g., U.S. Pat. No. 6,140,141.

FIG. 1a depicts in broken line a microscope objective 105 used for the optical inspection, and situated in alignment with the window 135. During testing, the cooling plate is placed on the exposed surface of the DUT 160, with the window 135 placed over the location of interest. When the cooling plate 110 is used with a transparent heat spreader 135, an oil layer, or other high index of refraction fluid, is sometimes provided between the transparent heat spreader 135 and the DUT 160 in order to improve the optical coupling from the DUT 160 to the transparent heat spreader 135. Heat from the device is conducted by the cooling plate to the conduits and the cooling liquid. The cooling liquid is then made to circulate through a liquid temperature conditioning system, such as a chiller, thereby removing the heat from the device. Typically, however, the DUT includes auxiliary devices 165, which limit the available motion of the cooling plate, thereby limiting the area available for probing. To overcome this, custom plates are made for specific devices, leading to increased cost and complexity of operation of the tester.

Another problem with the conventional cooling plate is insufficient and non-uniform heat removal from the DUT. FIGS. 1b and 1c schematically show a conventional cooling plate with a transparent heat spreader of a somewhat modified design from that of FIG. 1a. FIG. 1b is a top view, while FIG. 1c is a partial cross section along lines A—A in FIG. 1b. A transparent heat spreader 110' is soldered to a frame 130 using, for example, an indium solder at interface 115. A DUT (not shown) is observable through transparent heat spreader 110', and oil or other fluid may be provided between the DUT and the heat spreader. The frame 130 is attached to, or is formed as an integral part of, an inner metallic heat sink 140 which, in turn, is attached to an outer metallic heat sink 150. Conventionally, the inner metallic heat sink 140 is attached to the outer metallic heat sink 150 using screws and having no heat conducting material therebetween. Chilled air is pumped through inlet 170 to circulate through the outer metallic heat sink 150, and is exhausted through outlet 175.

As can be understood, heat is transported from the DUT to the transparent heat spreader 110', to the frame 130, to the inner metallic heat sink 140, to the outer metallic heat sink 150, and to the chilled fluid. However, the interfaces between the various elements act to resist heat conduction, thereby reducing the efficiency of heat removal from the DUT. Additionally, the temperature gradient across the various elements encourages heat gain from the ambient. In fact, studies have shown that heat gain from the ambient can be greater than the heat removal from the DUT. The thermal resistance present in the heat conduction path, along with the significant heat gained from the ambient, combine to dramatically increase the difficulty in lowering the temperature of the transparent heat spreader and, thereby, lowering the temperature of the DUT.

Of particular interest to the present inventors is the temperature at the periphery of the transparent heat spreader (locations of 1–8 in FIG. 1b). That is, the inventors speculated that a system having efficient heat transport will lower the temperature at the periphery of the transparent heat spreader, and thereby the temperature of the heat spreader and the DUT. To investigate that, a temperature distribution of an industry standard semiconductor thermal test chip, cooled by transparent heat spreader as exemplified in FIG. 1b, was simulated using a Finite Element model. The model simulated the temperature distribution in the transparent heat spreader, as well as the heat conduction from the transparent heat spreader, across the indium solder, to the periphery of the inner metallic heat sink. Using a one dimensional heat conduction analysis to calculate the temperature rise from the surface of the transparent heat spreader to the chip, the chip's temperature distribution, and its maximum temperature, were determined. The accuracy of the prediction of the Finite Element model is directly tied to the accuracy of the imposed boundary conditions. In this case, a key boundary condition is the temperature at the inner periphery of the inner metallic heat sink, i.e., at the indium solder contact area. As can be understood, the temperature at this periphery is dependent upon the heat removal efficiency of the entire assembly.

The impact of the boundary condition on the DUT's maximum temperature can be determined from FIG. 2 (determined with the Finite Element model). FIG. 2 is a plot of the transparent window's maximum temperature as a function of the boundary condition for various heat loads, wherein this maximum temperature drives the maximum DUT temperature. As is evident from FIG. 2, the lower the temperature at the periphery of the heat sink, the lower the maximum temperature of the transparent window, which will result in a lower maximum DUT temperature. That is, the inventors speculated that a system that can efficiently lower the temperature at the boundary of the transparent window, will also efficiently remove heat from the DUT.

To verify the accuracy of the model, extensive experiments were conducted with a test chip, using a cooling plate assembly similar to that of FIG. 1b. The DUT was powered to various heat fluxes, while being cooled by the cooling plate in a conventional manner. The cooling plate was instrumented for temperature measurements at the locations marked 1–18 in FIG. 1b, and the results for a chip powered at 20 W/cm$^2$ are shown in FIG. 3 (data are provided in degrees Centigrade). The results at the periphery of the transparent heat spreader were used as the boundary condition for further Finite Element model analysis. The model was executed and a prediction was made of the temperature distribution in the transparent window, as well as its maximum temperature. The maximum DUT temperature was then calculated as a function of the oil layer thickness and plotted in FIG. 4. For a measured oil layer thickness of 80 $\mu$m, the results of FIG. 4 correspond with the experimentally measured temperatures of the test DUT, thereby verifying the accuracy of the model.

As can be readily understood from the above discussion there is a need for an innovative, inexpensive, flexible, and thermally effective thermal management solution for chip testers or probers.

SUMMARY OF THE INVENTION

The results of the investigation detailed above highlight the importance of lowering the temperature at the periphery of the transparent window to the maximum extent possible. The present invention provides effective solutions for heat removal from the periphery of the transparent window, thereby providing a mechanism for removing heat from a DUT and allowing for inspection of the device under electrical stimulation. Therefore, the system is particularly adaptable for use with optical microscopes used for probing, diagnostics and failure analysis of the DUT.

In one aspect of the invention, a thermal management system is provided which utilizes a heat spreader for removing heat from the DUT and an atomized liquid spray system for removing heat from the heat spreader.

In another aspect of the invention an objective lens housing and a transparent cooling plate are placed inside a spray chamber. A spray cooling arrangement is provided to spray coolant onto the cooling plate. The spray chamber is sealed to a plate upon which the DUT is situated. The pressure inside the chamber may be controlled to obtain the proper evaporation of the sprayed coolant. Pressure transducers and temperature sensors may be installed on the pressure chamber to monitor the operation of the thermal management system.

In another aspect of the invention, the spray cooling is accomplished using several banks of atomizers to cool the periphery of the transparent heat spreader. According to one implementation, all of the atomizers are commonly connected to one liquid supply. On the other hand, according to other implementations, liquid delivery to each, or to groups, of atomizers may be controlled separately so as to vary the pressure, the timing, and/or the type of liquid delivered to various atomizers.

In yet another aspect of the invention, a cooling plate is soldered onto a holder. The holder is used to press the cooling plate against the DUT. Several atomizers are provided for spraying cooling fluid onto the periphery of the cooling plate. The holder may additionally serve to prevent the sprayed fluid from reaching the central part of the cooling plate, so as not to obscure the optical path.

In a further aspect of the invention, a cooling plate is soldered onto a holder. The holder is used to press the cooling plate against the DUT. The holder is provided with a hollow cavity, inside which the atomizers are a fixed. The atomizers spray cooling liquid onto the upper interior part of the holder, and the sprayed liquid is then evacuated via the hollow cavity inside the holder. In this manner, no liquid reaches the cooling plate; rather, heat is removed from the cooling plate via the cooled holder.

According to a further aspect of the invention, a DUT is affixed onto a pc board and the cooling plate is provided over the DUT. A metallic clamp holds the cooling plate and the DUT onto the pc board. An indium gasket may be provided between the metallic clamp and the cooling plate. A hollow holder is then pressed against the metallic clamp. Another indium gasket may be placed between the metallic gasket and the holder. The holder is provided with hollow injection chamber, inside which the atomizers are affixed, and hollow return chamber for collecting sprayed liquid. The atomizers spray cooling liquid onto the upper interior part of the holder, and the sprayed liquid is then evacuated via the hollow return chamber inside the holder. In this manner, no liquid reaches the cooling plate; rather, heat is removed from the cooling plate via the cooled holder.

According to yet another aspect of the invention, a transparent heat spreader is movably attached to the objective assembly via a holder. The holder may slide freely, be spring loaded, or flexibly mounted to the objective assembly. This arrangement is provided so that once the heat spreader is placed against the DUT, the objective assembly may be moved further in order to reach appropriate focus point. Coolant is delivered to the spray heads, which deliver coolant spray onto the heat spreader or, optionally, also onto the DUT itself.

According to yet another aspect of the invention, a transparent heat spreader is provided having both a cooling channels and a cooling spray.

In a further aspect of the invention, control instrumentation is provided for accurate operation of the thermal management system. The DUT temperature can be controlled via coolant temperature, coolant flow rate (directly tied to coolant delivery pressure), and coolant boiling point (a function of spray chamber pressure and vapor temperature. Note that at its saturation temperature, the temperature of the saturation liquid is the same as its vapor (non-superheated)). A temperature sensor close to the coolant delivery point monitors the coolant delivery temperature, which is fed back to the thermal management system's controller. The controller controls a liquid temperature conditioning system, which may be a chiller or other device to control the coolant's temperature to a pre-determined value. Such systems are well known to those skilled in the art.

Spray chamber pressure is measured with a pressure transducer in communication with the spray chamber. Vapor temperature (measured with a temperature sensor in communication with the spray chamber) and spray chamber pressure determine the coolant's boiling point, which in turn influences the manner in which the DUT temperature is controlled (via the transparent cooling plate). The spray chamber pressure can be manipulated to influence the coolant's boiling point. The spray chamber pressure may be affected, for example, by a solenoid valve in communication with the spray chamber, by adjusting the return pump's speed, or by manipulating the pressure inside the liquid temperature conditioning system's reservoir. A mechanical pressure relief valve provides a safety release in the event that the solenoid valve fails.

One or more of the afore-mentioned approaches, individually or in combination, may be used to control the coolant flow rate and/or the coolant's boiling point. The ultimate goal is to use the instrumentation to control the DUT to a pre-determined temperature. The temperature of the DUT may be measured by mechanical contact with a thermocouple or other sensor, by non-contact means such as a thermal imaging camera, or by any other means suitably accurate for the intended temperature stability. Any means for measuring the DUT temperature may be employed in the control of the DUT temperature. The specific examples given here are meant for illustrative purposes only and are not meant to limit this invention in any way.

A computer or other electronic or mechanical control system may be used to monitor DUT temperature and provide the necessary adjustment of spray. For example, if the DUT temperature rises, the computer could increase the flow rate, decrease the fluid temperature, or both.

The terms "transparent window" and "transparent heat spreader" are used herein somewhat interchangeably. As can be appreciated, the element functions as a window for the optical system, and as a heat spreader for the thermal management system. Also, the term "transparent" is used herein loosely. That is, as can be appreciated, a window may be transparent to a system operating a one wavelength, while opaque for system operating at another wavelength. For example, a "transparent" window for a system operating at the IR range, may be opaque at the visible range. Therefore, when used herein, the term "transparent" means transparent for the wavelength of interest.

The invention further comprises a method for controlling the temperature of an integrated circuit (IC) undergoing diagnostics, the method comprising: attaching the IC to a socket; providing a transparent heat spreader over the IC; and injecting coolant onto the transparent heat spreader from at least one spray head.

BRIEF DESCRIPTION OF THE DRAWINGS

The invention is described herein with reference to particular embodiments thereof, which are exemplified in the drawings. It should be understood, however, that the various embodiments depicted in the drawings are only exemplary and may not limit the invention as defined in the appended claims.

FIGS. 1a–1c depict cooling plate systems according to the prior art.

DETAILED DESCRIPTION

Various embodiments and implementations of the present invention can be used in conjunction with various IC testers and probers, so as to provide cooling of an IC that is electrically stimulated. For example, various embodiments of the invention can be easily implemented with IDS-PICA available from NPTest of San Jose, Calif., or with Gemini MS available from IMS of Beaverton, Oreg. In one general aspect, a transparent heat spreader and an atomized liquid spray is provided about a probe head so as to cool the DUT as the probe head collects data. Any probe head may be used, for example, the probe head may be in the form of an optical photon-counting time-resolved receiver, optical emission microscope, or laser-based probing tool. In order to provide a more detailed explanation of various aspects and features of the invention, the invention will be described with reference to more specific IC probers, i.e., optical photon-counting time-resolved emission probers. However, it should be appreciated that such detailed description is provided only as an example and not by way of limitation.

Figure 5:
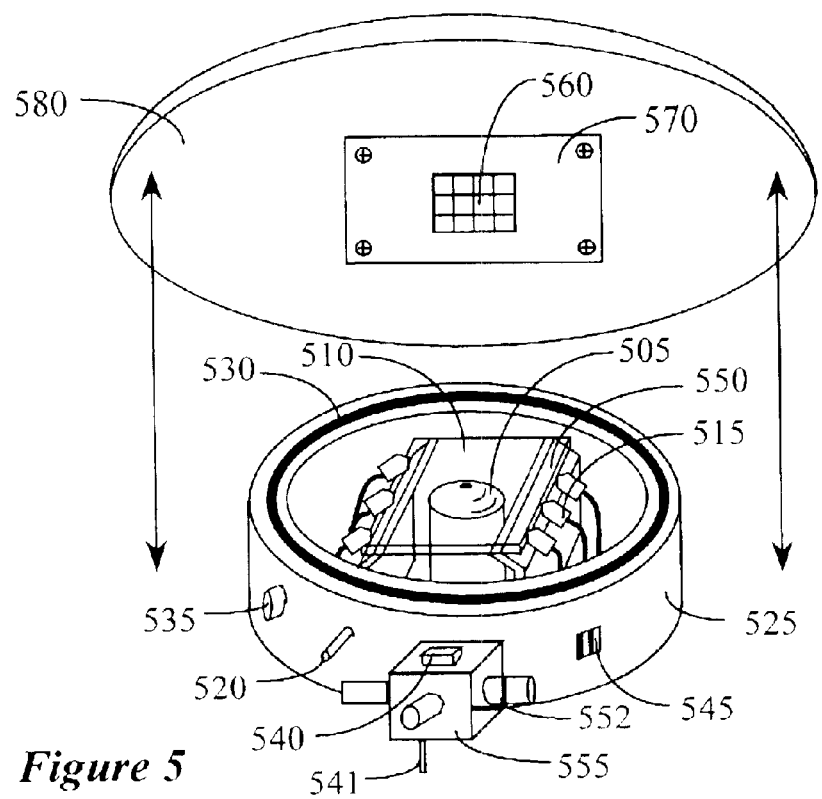
FIG. 5 is an exploded view of one embodiment of the inventive cooling system of the present invention.

FIG. 5 depicts an exploded view of one embodiment of the inventive cooling system. The cooling system depicted in FIG. 5 may be used with any type of microscope used for inspection and/or testing of ICs. For clarity, FIG. 5 shows only the objective lens portion optical inspection/probing system, and the parts relating to its cooling system. As shown in FIG. 5, a retention frame 570 holds the DUT 560 onto seal plate 580. The seal plate is mounted to a load board, which in turn is connected to a conventional test head (not shown) of a conventional automated testing equipment (ATE). The ATE sends stimulating signals to the DUT 560, to simulate operating conditions of the DUT 560. This is done conventionally using the load board with an appropriate socket for the DUT.

An objective housing 505 houses the objective lens of the testing system. The housing 505 and objective lens generally form an optical receiver of the system, i.e., the probe head. A transparent heat spreader 510 is mounted onto a holder 550, which generally may be a metallic holder. The heat spreader is made of a material that is permeable to the wavelength of radiation that is monitored by the particular tester used. For infrared, visible and UV radiation, the heat spreader may be made of ceramic, such as, for example, aluminum oxide, silicon oxide or mixture thereof. The heat spreader may also be made of a monocrystalline material such as, for example, sapphire. In one embodiment, the transparent heat spreader 510 is soldered, using, e.g., indium solder, to the holder 550.

Atomizers 515 are arranged so as to spray cooling fluid onto the periphery of the heat spreader 510. The atomizers are shown here only schematically with respect to their size, number and arrangement. For example, while only two banks of atomizers are shown on two opposite sides of the heat spreader 510, four banks may be provided so as to cool the entire periphery of the heat spreader 510. Also, in the context of this disclosure, the term "fluid" is used herein to signify both liquid and gaseous forms of cooling media.

The entire assembly is situated inside spray chamber 525, having a seal 530 affixed to its upper surface. The spray chamber 525 is affixed to a translation stage, e.g., an x-y-z stage (not shown). When performing testing in an embodiment employing the sliding seal, the spray chamber 525 is brought in contact with the sealing plate 580, so that sliding seal 530 creates a seal with the sealing plate 580. The seal may be hermetic, but a hermetic seal is not required. In this manner, the spray chamber 525 may be moved about so as to bring the objective lens into registration with the particular area of the DUT sought to be imaged, without breaking the seal with the sealing plate 580. Alternatively, the objective housing 505 may be movable with respect to the heat spreader 510, so that once the heat spreader 510 is applied against the DUT it need not be moved for testing different locations on the DUT.

In another embodiment, the housing 525 is connected to the sealing plate 580 through a flexible bellows (not shown). The bellows material should be compatible with the coolant temperature and chemical properties. Some potential materials include folded thin-walled steel and rubber.

During testing, fluid is supplied to the atomizers 515 via coolant supply manifold 555. The boiling point of the coolant can be controlled by controlling the pressure inside the spray chamber 525 using solenoid 520, or otherwise. In one implementation of the invention, the pressure inside the spray chamber 525 is measured using pressure transducer 552 and of that of the coolant supply is measured using pressure transducer 540, while the temperature of the cooling fluid is measured with temperature sensor 541 and of the vapor in the spray chamber using temperature sensor 545. As a safety measure, a mechanical pressure relief valve 535 is optionally provided. For fixed or varying coolant temperature and spray chamber pressure, the measured coolant delivery pressure is fed back to the controller to ensure adequate coolant delivery pressure for a required DUT temperature. The flow rate, and thus the cooling rate, can be controlled by the coolant delivery pressure.

Figure 6:
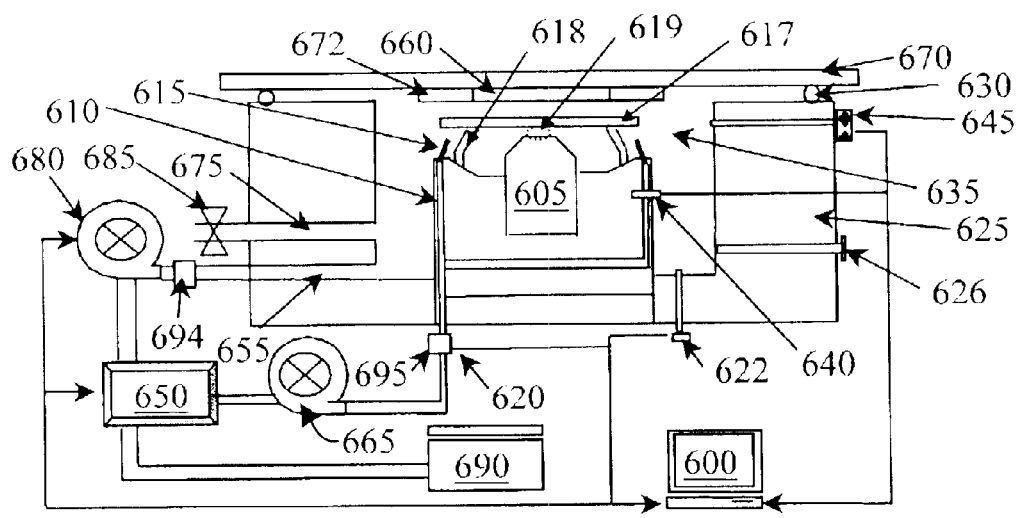
FIG. 6 is a cross section schematic of an embodiment of the inventive cooling system of the present invention.

FIG. 6 is a cross-sectional schematic of the spray cooling system according to an embodiment of the present invention. Specifically, DUT 660 is held in place by the DUT retention frame 672, which is attached to the DUT socket (not shown). The seal plate 670 is attached to the DUT load board (not shown), which is connected to a test adapter in a conventional manner. In this embodiment, spray chamber 625 is pressed against the seal plate 670 so as to form a seal using a sliding seal 630. Objective housing 605 is positioned below a transparent heat spreader 617, which is fitted with spray heads 615. Pump 680 is used to return fluid to the fluid temperature conditioning system, such as a chiller 650, and can also be used to control the pressure inside the chamber interior 635, typically at about 1 atm. It should be understood that the desired spray chamber pressure could be calculated according to the characteristics of the cooling fluid used and the boiling point desired (in a given embodiment).

Pump 665 is used to pump coolant through supply piping 695 to be injected onto the transparent heat spreader via spray heads, or atomizer banks, 615. In one embodiment of the invention, coolant is sprayed onto the heat spreader 617 in a liquid form, whereupon it is heated to its boiling point and then evaporates and vapor forms in the interior 635. The vapor may then condense on the chamber 625 walls, and is drained through channels 655, back into the pump 680. The vapor may also be directly fed into the chiller 650, although the load on the chiller will be increased. In another embodiment, the coolant simply absorbs the heat from the heat spreader 617 without evaporating, whereupon the unevaporated liquid is returned to the fluid temperature conditioning system. While two thermal management scenarios have been presented, those skilled in the art can appreciate the fact that the relative cooling strengths of the fluid heat absorption and the evaporation may be adjusted, for example, by choosing different fluids, nozzle design and number, fluid flow rate, fluid temperature, and chamber pressure as described above.

The fluid may then be circulated through the fluid temperature conditioning system 650 before being sprayed again onto the heat spreader 617. The coolant used in this particular embodiment is of high vapor pressure, e.g., hydrofluoroethers or perfluorocarbons. Consequently, such fluids evaporate readily when exposed to atmospheric condition. Therefore, as shown in this embodiment, the entire cooling system forms a closed loop system. The closed system may be vented through the solenoid valve 685, which may also be operated in conjunction with a vapor recovery system such as a reflux condenser to mitigate additional vapor loss. For this purpose, the fluid temperature conditioning system 650 comprises a sealed chiller reservoir 690, capable of operating at both high and low pressures, i.e., 10 psi above atmospheric pressure or a full vacuum of −1 atm.

The reservoir 690 may also include a fluid agitation system (not shown) to enhance heat transfer from the coolant to the chiller coils (not shown). In this example, the chiller 650 and reservoir 690 are capable of operating at low temperatures of down to, for example, −80° C.

Using this system, the temperature of the DUT can be varied so as to be tested under various operating conditions. For example, the operator may input a certain operating temperature for testing the DUT. In one embodiment, the actual temperature of the DUT can be detected by the ATE (not shown) in a manner known to those skilled in the art. For example, a temperature diode may be embedded in the DUT, and its signal sent to the ATE. This is conventionally done for safety reasons such as, for example, to shut down the system if the DUT gets too hot. However, according to this embodiment of the invention, the temperature of the DUT is sent from the ATE to the controller 600. Using the actual DUT temperature, the controller 600 adjusts the cooling rate so as to operate the DUT at the temperature selected by the operator. To control the cooling rate, the controller 600 may adjust, for example, the flow rate of coolant, the temperature of the coolant, or change the pressure in the chamber so as to change the boiling point of the cooling liquid.

As shown in FIGS. 5 and 6, and as alluded to above, various sensors and instrumentation may be used to control the operation of the inventive cooling system. A pressure transducer 620 measures the coolant delivery pressure so as to control the pump 665 speed. Additionally, a pressure transducer 622 measures the pressure inside the spray chamber so as to control a solenoid valve 685 to obtain the appropriate coolant boiling point inside the spray chamber. Optionally, another transducer 694 is provided to monitor the pressure of the returned coolant. Temperature sensor 640 is used to measure the coolant temperature close to the point of delivery, while the vapor temperature in the spray chamber is measured with temperature sensor 645. Notably, from the spray chamber pressure and the vapor temperature (or coolant at its saturation temperature), it is possible to determine the thermodynamic state of the coolant delivered to the stimulated DUT. A mechanical pressure relief valve 626 provides a safety release in the event that the solenoid valve 685 fails.

In the embodiments of FIGS. 5 and 6, the effect of the atomized coolant on imaging needs to be minimized. One way to do this is by using the heat spreader carrier, 550, 618, operating as a shield, so as to prevent the mist from entering the optical axis of the imaging system. In this manner, the sprayed fluid impinges only on the periphery of the heat spreader, so that the field of view of the objective is not obstructed by fluid. However, as noted above, effective control of the temperature at the periphery of the heat spreader results in effective control of the DUT's temperature. Therefore, the embodiments described herein are very effective in controlling the DUT's temperature.

As noted above, oil, or other high index of refraction liquid, may be provided between the heat spreader and the DUT. Additionally, in various embodiments of the invention, oil, or other high index of refraction liquid, is placed between the heat spreader and the objective lens. In other embodiments of the invention, an optional solid immersion lens (SIL) 619 is provided in contact with the heat spreader so as to efficiently collect light from the DUT and direct it to the objective lens. The SIL enables transmission of optical energy between the heat spreader and the objective lens and may be used alone, or in combination with a high index of refraction liquid.

Solid immersion lenses (SIL) are well known in the art and are described in, for example, U.S. Pat. Nos. 5,004,307, 5,208,648, and 5,282,088, which are incorporated herein by reference. FIG. 6 depicts in broken line an embodiment of the cooling system of the invention used in conjunction with an optional SIL. In this embodiment, a SIL 619 is affixed to the tip of the objective housing 605. In operation, the SIL 619 is "coupled" to the heat spreader 617, so as to allow communication of evanescent wave energy. In other words, the SIL is coupled to the heat spreader 617 so that it captures rays propagating in the heat spreader 617 at angles higher than the critical angle (the critical angle is that at which total internal reflection occurs). As is known in the art, the coupling can be achieved by, for example, physical contact with the imaged object, very close placement (up to about 20–200 micrometers) from the object, or the use of index matching material or fluid.

In the embodiment of FIGS. 5 and 6, two banks of atomizers are shown. It should be appreciated, however, that the number of atomizers and the number of banks of atomizers are provided only as examples, and other numbers and arrangements may be used. For example, the atomizers may be placed in a circular arrangement about the objective housing, rather than in linear banks. Furthermore, various injectors may be operated at different spray rates or be provided with different cooling fluid, or same cooling fluid, but at different temperature. Optionally, different spray heads may be adjusted to provide spray at different angles.

Figure 7:
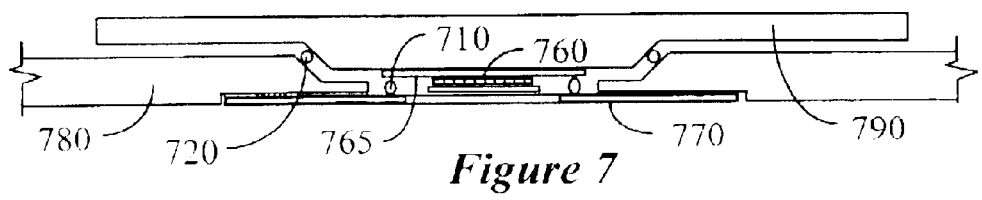
FIG. 7 depicts a cross section schematic of an embodiment of the inventive cooling system.

An exemplary arrangement of mounting the DUT to a conventional tester head adapter is depicted in FIG. 7. The DUT 760 is mounted via a socket (not shown) onto the DUT board 790 and held in place by retention frame 770. An o-ring seal 710 may be provided between the DUT retention frame 770 and the DUT carrier 765. In addition, an o-ring seal 720 may be provided between the seal plate 780 and the load board 790.

Figure 8:
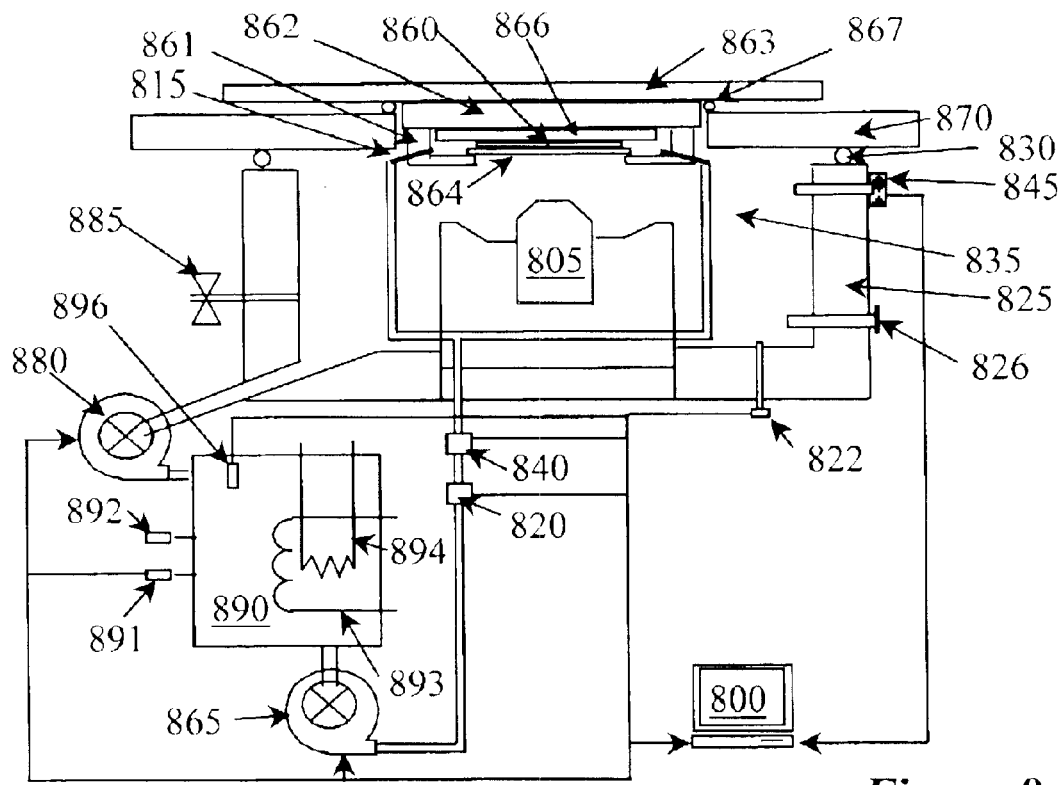
FIG. 8 is a schematic of another embodiment of the inventive cooling system.

A further embodiment of the inventive spray cooling system is depicted in FIG. 8. In this embodiment the transparent heat spreader 864 is pressed against the DUT 860, which, in turn, is attached to the DUT carrier 866 and socket 862. The heat spreader 864 is held in place by the retention frame 861, rather than by the optics carrier. Atomizer banks 815 are provided about the periphery of the heat spreader 864. In this particular example, an optional seal 867 is provided between seal plate 870, socket 862, and DUT board 863. This ensures that no vapor will escape in the space between these parts.

The spray chamber 825 is held against the seal plate 870 so that seal 830 makes a seal with the seal plate 870. The condition inside chamber interior 835 is monitored using pressure transducer 822 and temperature sensor 845. The pressure inside chamber interior 835 is controlled using solenoid valve 885. Additionally, a mechanical pressure relief valve 826 is provided for safety.

Cooling fluid is provided to the atomizer banks 815 using supply pump 865. The pressure of the delivered fluid is measured by pressure transducer 820, and the temperature is measured by temperature sensor 840. After being sprayed, the fluid is collected and is pumped back to chiller reservoir 890 using return pump 880. The fluid level inside the chiller is monitored by level sensor 896, which can also be used as an added variable for thermal management control, while the pressure inside the chiller is monitored by pressure transducer 891. A mechanical pressure relief valve 892 is provided for safety. The temperature of the fluid inside the chiller is controlled using chiller coils 893 and heater 894.

As shown, all the sensors, actuators, and pumps are connected to computer/controller 800.

As is known, in order to inspect the DUT, it is customary to thin the DUT. Consequently, when devices generate heat, the heat does not spread well over the entire DUT and a localized hot spot is created. In this embodiment, a transparent heat spreader 864 is provided in contact with the DUT 860, so as to enhance spreading of heat from localized hot spots. As in the above embodiments, oil or other index matching fluid may be used between the heat spreader 864 and the DUT 860. The spray is then applied onto the periphery of the heat spreader 864, which may be made from, for example, silicon, sapphire, diamond, etc.

Figure 9A:
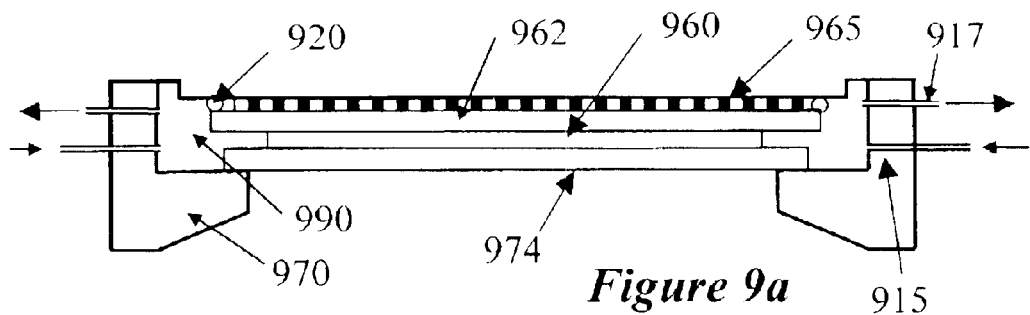
FIGS. 9a and 9b are cross section schematics of DUT with a cooling plate holder arrangement according to two alternative embodiments of the invention.
Figure 9B:
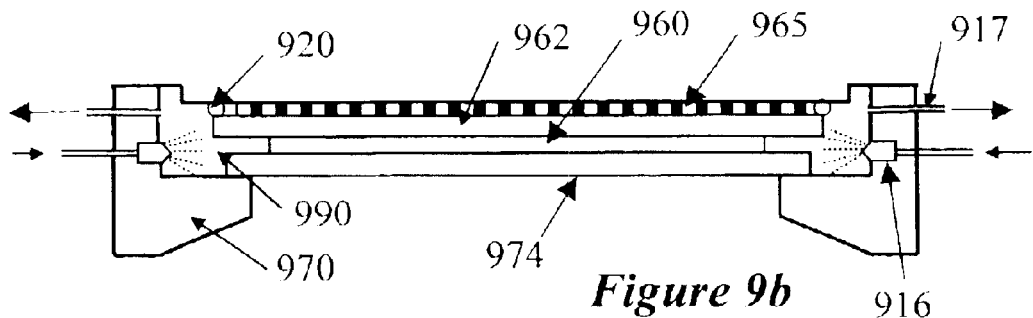

FIGS. 9a and 9b are cross-section schematics of DUT holder arrangements with heat spreader retention frame, which can be used in the embodiment of FIG. 8. The DUT 960 is held against socket 965 by the transparent heat spreader 974, which is held in place by retention frame 970. An o-ring 920 is provided between the DUT carrier 962 and socket 965. The transparent cooling plate 974 may be sealed to the retention frame 970 by, for example, indium or epoxy bonding, silicon sealant, and the likes. For enhanced heat conduction, indium solder may be used. The retention frame 970 may be screwed or otherwise attached to the test adapter (not shown). Fluid inlets 915 and outlets 917 are provided in the retention frame 970. As can be appreciated from FIGS. 9a and 9b, the retention frame 970, heat spreader 974, and socket 965 define a void 990. Coolant is circulated in void 990 using inlets 915 and outlets 917, as shown in FIG. 9a. On the other hand, in FIG. 9b the fluid is sprayed into void 990 using spray heads 916, and is evacuated using outlets 917. Notably, in either example coolant fluid is not circulated in the optical path of the objective, but rather cools only the periphery of the heat spreader 974 and DUT 960. If collection of spent coolant is not important, such as, for example, when the coolant is air or liquid nitrogen, outlet 917 can simply be a non-hermetic setting between the frame 970 and socket 965. In such a case, spent coolant will simply evaporate via the non-hermetic setting into the atmosphere.

Figure 10:
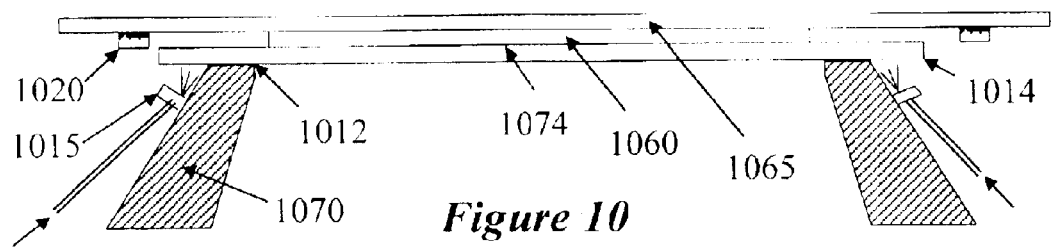
FIG. 10 is a cross section schematic of a DUT with a cooling plate holder arrangement according to an embodiment of the invention.

FIG. 10 is a cross section schematic of a transparent heat spreader arrangement held against a DUT. This illustrative example may be used with the embodiment of FIGS. 5 and 6. That is, in this embodiment, the DUT is attached to the DUT socket, while the transparent heat spreader is pressed against the DUT. As shown, DUT 1060 is attached to the DUT carrier 1065, which may or may not include periphery devices 1020 (e.g., capacitors). Prior to testing, a transparent heat spreader 1074 is pressed against the DUT 1060, with or without an index matching fluid in between. The heat spreader 1074 is attached to its holder 1070 by, for example, indium soldering 1012. Atomizers 1015 are attached to the holder 1070 so that they spray on the periphery of the heat spreader 1074. As shown, the holder 1070 may act as a "shield" so as to prevent the spray from reaching the central area of the heat spreader 1074 and obstruct the optical path.

Figure 11:
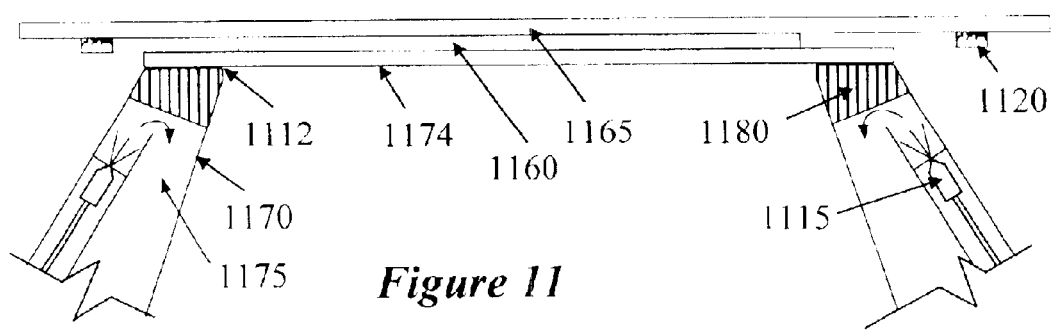
FIG. 11 is a cross section schematic of a DUT with a cooling plate holder arrangement according to an embodiment of the invention.

FIG. 11 is a cross section schematic of a transparent heat spreader arrangement held against a DUT. This illustrative example may be used with the embodiment of FIGS. 5 and 6. However, this embodiment may also be used in situation where no evaporation chamber, such as that shown in FIGS. 5 and 6, is provided. Notably, in this embodiment sprayed fluid is contained within the heat spreader holder and is circulated to the chiller for temperature control. As shown, DUT 1160 is attached to the DUT carrier 1165, which may or may not include periphery devices 1120 (e.g., capacitors). Prior to testing, a transparent heat spreader 1174 is pressed against the DUT 1160, with or without an index matching fluid in between. The heat spreader 1174 is attached to a holder 1170 by, for example, indium soldering 1112. The holder 1170 is made of a solid part 1180, which may be made of solid metal, and a hollow part 1175. Atomizers 1115 are situated inside the hollow part of the holder 1170, as shown. The atomizers spray the solid part 1180 of the holder 1170. The fluid then flows down the hollow part 1175 to be collected and/or circulated into the chiller. In this arrangement, heat from the DUT is conducted to the heat spreader 1174, then to the solid part 1180, and is removed therefrom by the spray from the atomizers 1115. Since in this case the fluid path is "closed-loop," no sealing plate or the like need to be provided and the arrangement may easily be used in various testing situations.

Figure 12:
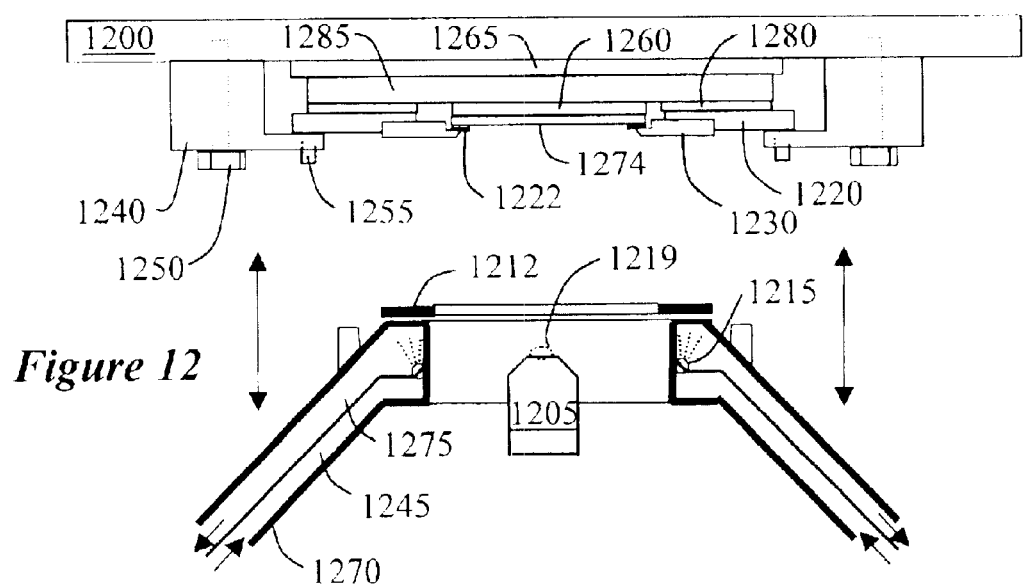
FIG. 12 is a schematic of another embodiment of the inventive cooling system.

Another embodiment of the invention is depicted in FIG. 12 in an exploded view. In this embodiment, the DUT and heat spreader can be fixed onto a PC board and be configured onto the test bench of an ATE or other testing equipment. The cooling to the heat spreader is provided separately and removably from the DUT-PC board arrangement. This embodiment is particularly advantageous since the PC Board, DUT and heat spreader form a separate and independent arrangement from the rest of the testing and cooling system, and may be conveniently assembled on a work bench and then moved and configured onto the testing system.

The PC board assembly comprises a conventional PC Board 1200, upon which a socket 1265 and a DUT package 1285 are affixed. The DUT 1260 is secured onto the socket 1265 in a conventional manner. A transparent heat spreader 1274 is then provided over the DUT 1260, with or without an index matching fluid. The heat spreader 1274 is pressed against the DUT 1260 using a copper clamp 1230 and an indium gasket 1222. The entire assembly is then secured by steel clamp 1240 via bolts 1250, which is aligned using guide pins 1255.

The spray cooling assembly comprises a holder 1270 having two hollow chambers therein: injection chamber 1245 and exhaust chamber 1275. The cooling spray assembly is pressed against the copper DUT clamp 1230, with an indium gasket 1212 provided in-between. The indium gasket may be a separate and replaceable part, or it may be soldered to the holder 1270. Cooling liquid is pumped into injection chamber 1245, and is being sprayed onto the top part of the holder 1270 by injectors 1215. The sprayed liquid then flows down the exhaust chamber and is pumped into the chiller for temperature control.

In the embodiments of FIGS. 6 and 8, it is shown that the cooling fluid is collected and is returned to the chiller system. However, this is not always necessary. For example, the cooling fluid may be chilled air. In such a case, the air may be chilled and is delivered under pressure to the spray heads, but it need not be collected after spraying. So, for example, pumps 680 and 880 may be eliminated. On the other hand, liquid nitrogen is generally readily available in institutions working on semiconductor chips. Therefore, liquid nitrogen can be used in embodiments of the invention.

Figure 13:
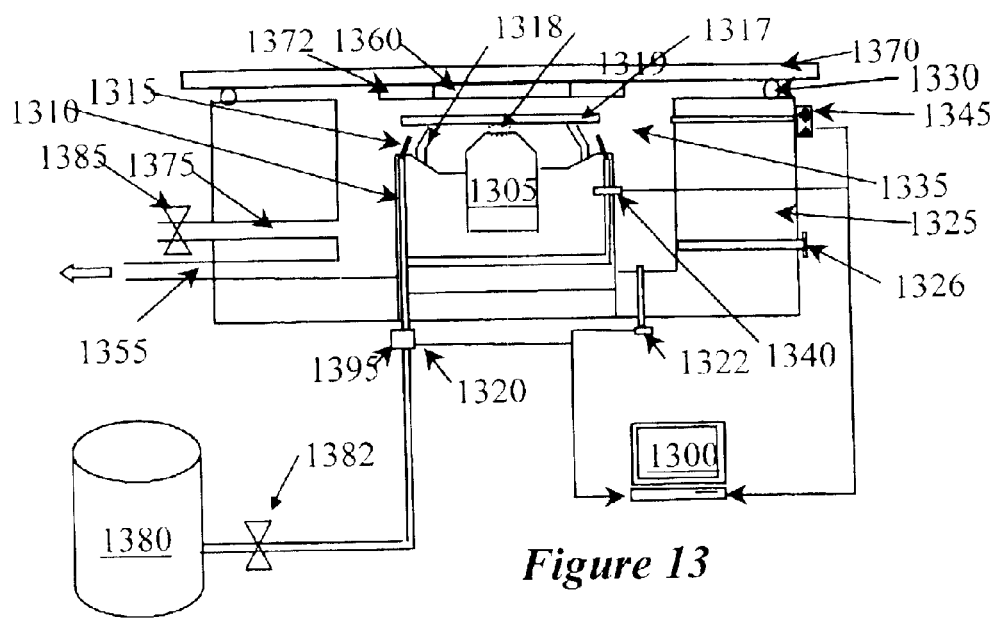
FIG. 13 is a schematic of another embodiment of the inventive cooling system.

FIG. 13 depicts an embodiment wherein liquid nitrogen is used as the coolant fluid. That is, most research and production facilities handling semiconductors have liquid nitrogen readily available "on tap." That is, facilities 1380 are provided to supply pressurized liquid nitrogen through an outlet valve connection 1382. Consequently, when using such facility for the supply of coolant, there is no need for the pumps and heat exchangers depicted in the embodiments of FIGS. 6 and 8. Rather, the liquid nitrogen can be delivered directly to the spray heads 1315.

Once the liquid nitrogen is sprayed upon the heat spreader 1317, it may or may not be collected. That is, one may use a cooling chamber 1325 with a sealing ring 1330 and plate 1370 in order to construct an enclosed environment that enables collection of the "spent" nitrogen via outlet 1355. On the other hand, the spent nitrogen may be discarded to the atmosphere. In such a case, there is no need to construct a cooling chamber and the spray heads 1315 and cooling plate 1317 may be open to the environment.

As in the embodiments of FIGS. 5 and 6, various sensors and instrumentation may be used to control the operation of the inventive cooling system. A pressure transducer 1320 measures the coolant delivery pressure so as to control the valve 1382. Additionally, a pressure transducer 1322 measures the pressure inside the spray chamber so as to control a solenoid valve 1385. Temperature sensor 1340 is used to measure the coolant temperature close to the point of delivery, while the vapor temperature in the spray chamber is measured with temperature sensor 1345. A mechanical pressure relief valve 1326 provides a safety release in the event that the solenoid valve 1385 fails. As can be readily understood, some or all of these various sensors and transducers may be changed or omitted if the system is designed so that spent nitrogen is released to the atmosphere.

Figure 1B:
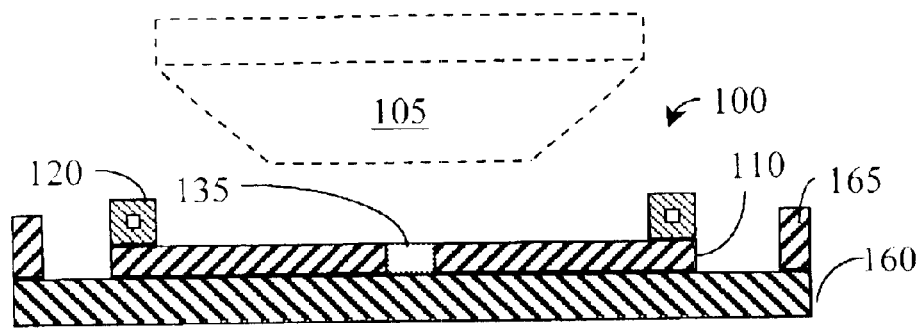
Figure 1B:
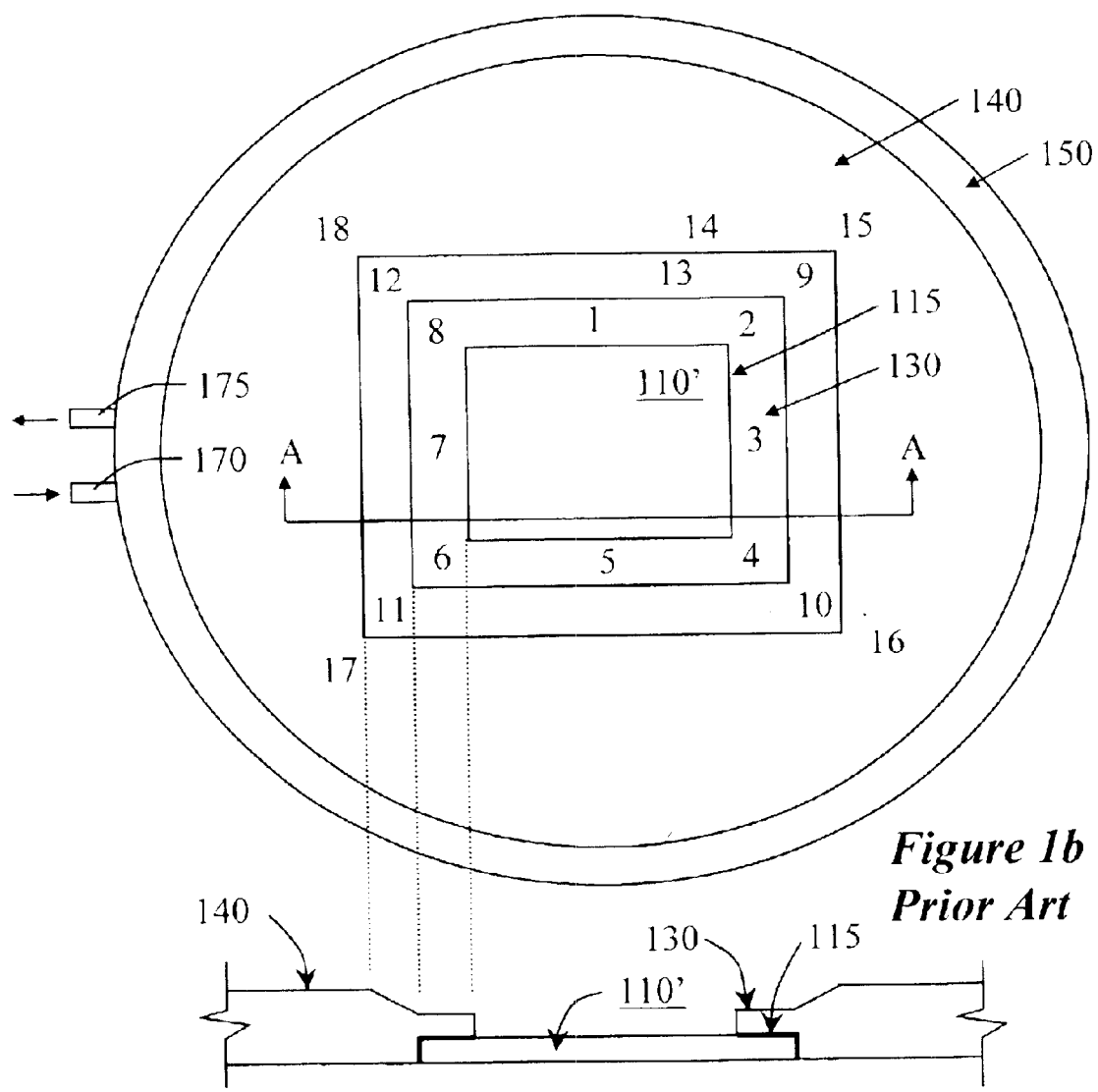
Figure 2:
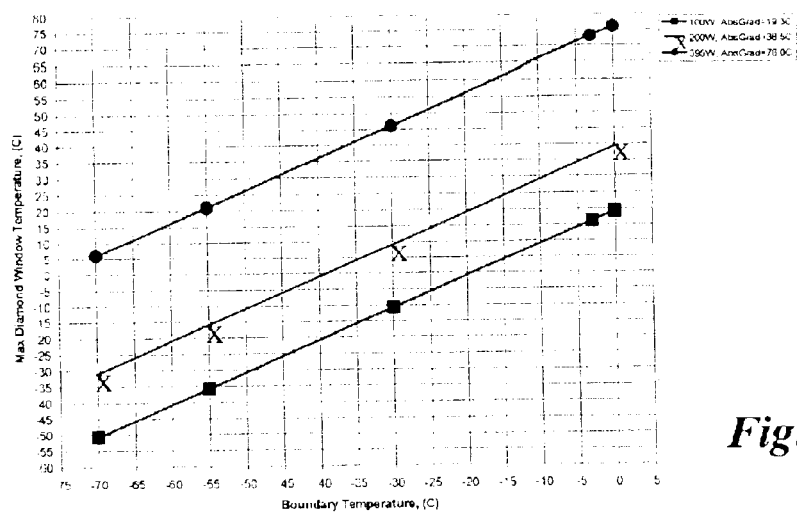
FIG. 2 is a graph of maximum temperature of the transparent heat spreader as a function of its boundary conditions, obtained from a Finite Element model.
Figure 3:
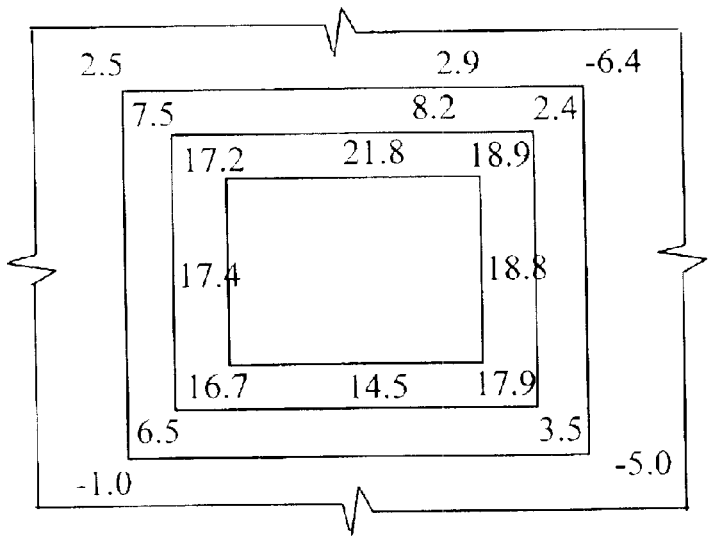
FIG. 3 depicts experimentally measured temperatures measured across a conventional transparent heat spreader assembly for 20 $W/cm^2$ applied to the DUT.
Figure 4:
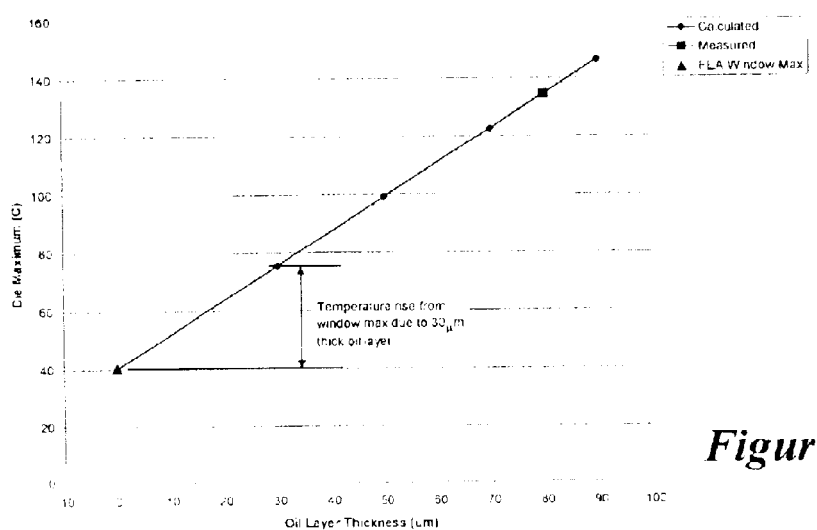
FIG. 4 is a graph of maximum die temperature as a function of oil film thickness at 20 $W/cm^2$ applied to the DUT.
Figure 14:
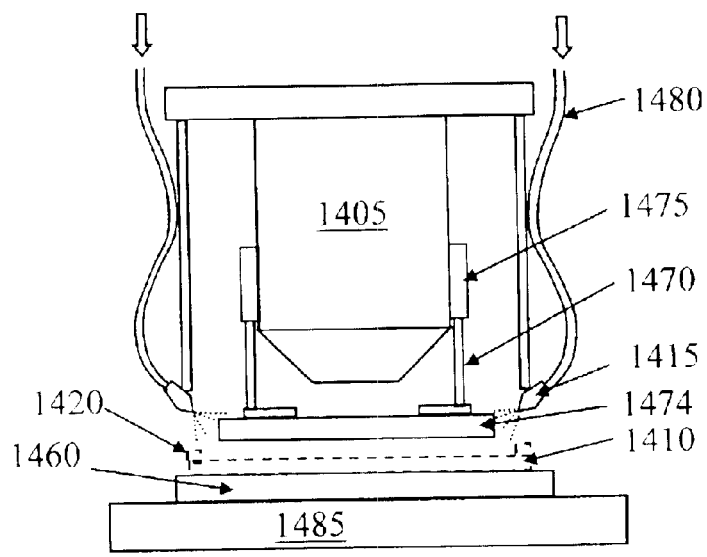
FIG. 14 is a schematic of another embodiment of the inventive cooling system.

FIG. 14 depicts another embodiment of the inventive system, wherein the transparent heat spreader 1474 is movably attached to the objective assembly 1405 via holder 1470. In this embodiment, holder 1470 may slide freely in housing 1475, or it may be spring loaded or flexibly mounted inside holders 1475. This arrangement is provided so that once the heat spreader 1474 is placed against the DUT 1460 (mounted onto socket 1485), the objective assembly 1405 may be moved further in order to reach appropriate focus point. When the holder 1470 is spring loaded, the transparent heat spreader 1474 can be physically pressed against the DUT 1460 so as to prevent or reduce any mechanical movement and vibrations between the transparent heat spreader 1474 and the DUT 1460. Coolant is delivered to the spray heads 1415 via pipes or hoses 1480. The spray heads 1415 deliver coolant spray onto the heat spreader 1474. Optionally, the spray heads 1415 may also deliver coolant spray onto the DUT 1460 itself. Optionally, the holder 1470 may be formed as a cylinder, movably attached to a cylindrical housing 1475. Such an arrangement is advdentageous as the cylindrical holder 1470 would prevent any coolant from reaching the optical path of the objective. As also exemplified in FIG. 14, the arrangement of this embodiment may be used in conjunction with another transparent heat spreader 1410, such as, for example, the conventional heat spreader 110 shown in FIG. 1a. In such a case, the heat spreader 1474 would be pressed against the heat spreader 1460. Further optionally, cooling channels may be provided in or on the heat spreader 1410, such as, for example, the conventional cooling channels 120 shown in FIG. 1a.

Figure 15:
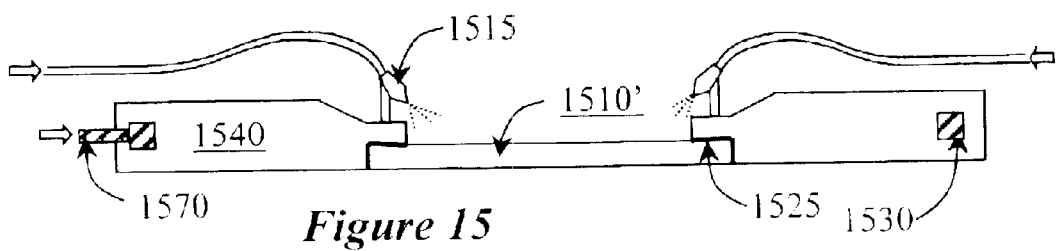
FIG. 15 is a schematic of a further embodiment of the inventive cooling system.

FIG. 15 is a schematic of a further embodiment of the inventive cooling system, wherein a conventional cooling plate 1540 is used. The conventional cooling plate includes a transparent heat spreader 1510', cooling fluid input/output hookups 1570, and cooling fluid channel 1530. The heat spreader 1510' may be connected to the cooling plate via an indium solder 1525. However, according to this embodiment, in order to enhance heat removal from the periphery of the heat spreader, spray heads 1515 are positioned to provide cooling spray onto the cooling plate.

While the invention has been described with reference to particular embodiments thereof, it is not limited to those embodiments. Specifically, various variations and modifications may be implemented by those of ordinary skill in the art without departing from the invention's spirit and scope, as defined by the appended claims. Additionally, all of the above-cited prior art references are incorporated herein by reference.

What is claimed:

1. A semiconductor chip thermal management system, comprising:
   a transparent heat spreader configured for placing over said semiconductor chip;
   at least one spray head situated to provide coolant spray at least partially onto said transparent heat spreader;
   a coolant delivery system, providing said coolant to said spray head.

2. The semiconductor chip thermal management system of claim 1, wherein said coolant comprises one or combination of water, liquid nitrogen, chilled air, hydrofluoroethers or perfluorocarbons.

3. The semiconductor chip thermal management system of claim 1, further comprising:
   a coolant temperature conditioning system;
   a coolant displacement mechanism providing said coolant to said spray head from said temperature conditioning system.

4. The semiconductor chip thermal management system of claim 3, further comprising coolant recovery system delivering collected coolant to said coolant temperature conditioning system.

5. The semiconductor chip thermal management system of claim 1, wherein said spray head is configured to provide coolant spray only onto a periphery of said transparent heat spreader.

6. The semiconductor chip thermal management system of claim 1, further comprising a holder upon which said transparent heat spreader is affixed.

7. The semiconductor chip thermal management system of claim 6, wherein said transparent heat spreader is affixed to said holder via an indium solder.

8. The semiconductor chip thermal management system of claim 6, wherein said holder shields interior section of said transparent heat spreader from said coolant spray.

9. The semiconductor chip thermal management system of claim 1, further comprising:
   a cooling chamber having one side thereof exposed to said semiconductor chip;
   a seal provided on said cooling chamber on the side exposed to said semiconductor chip.

10. The semiconductor chip thermal management system of claim 1, further comprising a transparent plate provided between said semiconductor chip and said transparent heat spreader.

11. An integrated circuit (IC) thermal management system for use with an IC tester stimulating said IC, comprising:
    a transparent heat spreader provided over said IC;
    a holder having an upper portion engageable with said heat spreader; and,
    at least one spray head providing coolant fluid spray to remove heat from said heat spreader.

12. The integrated circuit (IC) thermal management system of claim 11, wherein said coolant fluid comprises one or a combination of water, liquid nitrogen, chilled air, hydrofluoroethers or perfluorocarbons.

13. The IC thermal management system of claim 11, further comprising:

a coolant fluid temperature conditioning system;

a fluid displacement mechanism;

fluid piping providing said coolant fluid to said spray head from said temperature conditioning system, via said fluid displacement mechanism; and, return piping delivering said coolant fluid to said temperature conditioning system.

14. The IC thermal management system of claim 11, wherein said holder comprises a hollow delivery conduit inside which said spray head is situated.

15. The IC thermal management system of claim 14, wherein said holder further comprises a return conduit through which sprayed cooling fluid is collected.

16. The IC thermal management system of claim 15, further comprising an indium gasket provided between said holder and said heat spreader.

17. The IC thermal management system of claim 16, further comprising a metallic clamp provided over said heat spreader.

18. The IC thermal management system of claim 17, further comprising an indium gasket provided between said metallic clamp and said heat spreader.

19. The semiconductor chip thermal management system of claim 13, wherein said temperature conditioning system is a chiller.

20. The semiconductor chip thermal management system of claim 13, wherein said fluid displacement mechanism is a pump.

21. A diagnostics fixture for testing an integrated circuit (IC), said diagnostics fixture including a thermal management system for controlling the temperature of said IC, comprising:

a board for holding and providing electrical contact to said IC;

a first cooling plate provided over said IC, said first cooling plate comprising a transparent heat spreader, and;

a plate holder in physical contact with said first cooling plate;

at least one spray head providing coolant fluid spray.

22. The diagnostics fixture of claim 21, wherein said coolant fluid comprises one of liquid nitrogen, chilled air, hydrofluoroethers or perfluorocarbons.

23. The diagnostics fixture of claim 21, further comprising a holder in physical contact with said heat spreader, and wherein said spray head is affixed to said holder.

24. The diagnostics fixture of claim 23, wherein said holder is hollow and wherein said spray head is situated inside said holder.

25. The diagnostics fixture of claim 23, wherein said holder is soldered to said first cooling plate.

26. The diagnostics fixture of claim 21, further comprising a second cooling plate provided between said IC and said first cooling plate.

27. The diagnostics fixture of claim 26, wherein said second cooling plate comprises cooling channels having cooling fluid circulated therein.

28. A diagnostics fixture for use with a diagnostics probe for an integrated circuit (IC), said diagnostics fixture including a thermal management system for controlling said IC, comprising:

a socket for holding and providing electrical contact to said IC;

a transparent cooling plate provided over said IC;

a plate holder in physical contact with said cooling plate, said plate holder comprising coolant inlet; and, wherein said socket, IC, and plate holder define a void for circulating coolant provided from said coolant inlet, said coolant contacting only peripheral areas of said transparent cooling plate and IC, and being prevented from reaching optical path of said probe.

29. The diagnostics fixture of claim 28, further comprising at least one spray head coupled to said coolant inlet.

30. A method for controlling the temperature of an integrated circuit (IC) undergoing diagnostics, said method comprising:

attaching said IC to a socket;

providing a transparent heat spreader over said IC;

injecting coolant onto said transparent heat spreader from at least one spray head.

* * * * *